United States Patent
Hwang

(10) Patent No.: US 8,044,576 B2
(45) Date of Patent: Oct. 25, 2011

(54) ORGANIC LIGHT EMITTING DISPLAY AND METHOD OF FABRICATING THE SAME

(75) Inventor: Eui-Hoon Hwang, Suwon-si (KR)

(73) Assignee: Samsung Mobile Display Co., Ltd., Yongin, Gyunggi-do (KR)

( * ) Notice: Subject to any disclaimer, the term of this patent is extended or adjusted under 35 U.S.C. 154(b) by 0 days.

(21) Appl. No.: 11/473,830

(22) Filed: Jun. 22, 2006

(65) Prior Publication Data

US 2006/0290634 A1    Dec. 28, 2006

(30) Foreign Application Priority Data

Jun. 22, 2005   (KR) ................. 10-2005-0054164

(51) Int. Cl.
*C09K 19/00*   (2006.01)

(52) U.S. Cl. ...... 313/506; 428/1.51; 428/1.52; 313/500; 313/509; 345/92

(58) Field of Classification Search .......... 313/495–512; 315/169.3, 169.4; 257/40, 79; 428/690, 428/1.51, 1.52; 345/30, 36, 44, 45, 92
See application file for complete search history.

(56) References Cited

U.S. PATENT DOCUMENTS

| | | | |
|---|---|---|---|
| 5,508,067 A | 4/1996 | Sato et al. | |
| 5,714,408 A * | 2/1998 | Ichikawa et al. | 438/761 |
| 6,274,887 B1 * | 8/2001 | Yamazaki et al. | 257/72 |
| 6,380,014 B1 * | 4/2002 | Ohta et al. | 438/197 |
| 6,433,487 B1 * | 8/2002 | Yamazaki | 315/169.3 |
| 7,235,810 B1 * | 6/2007 | Yamazaki et al. | 257/59 |
| 2003/0157754 A1 * | 8/2003 | Yamazaki et al. | 438/162 |
| 2004/0080263 A1 * | 4/2004 | Yamazaki et al. | 313/499 |
| 2004/0238820 A1 * | 12/2004 | Sakama et al. | 257/59 |
| 2004/0262613 A1 * | 12/2004 | Maekawa et al. | 257/72 |
| 2005/0116291 A1 * | 6/2005 | Koo et al. | 257/347 |

FOREIGN PATENT DOCUMENTS

JP    07-273347    10/1995

(Continued)

OTHER PUBLICATIONS

Fandino et al., "Role of hydrogen on the deposition and properties of fluorinated silicon-nitride films prepared by inductively coupled plasma enhanced chemical vapor deposition using SiF4/N2/H2 mixtures", *Journal of Vacuum Science and Technology A: Vacuum, Surfaces, and Films*; vol. 23, Issue 2, pp. 248-255 (Feb. 2, 2005).

(Continued)

*Primary Examiner* — Karabi Guharay
*Assistant Examiner* — Elmito Breval
(74) *Attorney, Agent, or Firm* — Knobbe Martens Olson & Bear LLP

(57) ABSTRACT

An organic light emitting display (OLED) and a method of fabricating the same are provided. The OLED includes a substrate and a thin film transistor disposed on the substrate. A first inorganic passivation layer is disposed on the thin film transistor. A second inorganic passivation layer whose hydrogen content is higher than that of the first inorganic passivation layer is formed on the first inorganic passivation layer. A pixel electrode electrically connected to the thin film transistor is disposed on the second inorganic passivation layer.

8 Claims, 4 Drawing Sheets

FOREIGN PATENT DOCUMENTS

| | | |
|---|---|---|
| JP | 2001-053286 | 2/2001 |
| JP | 2002-170960 | 6/2002 |
| JP | 2002-246602 | 8/2002 |
| JP | 2003-007716 | 1/2003 |
| KR | 10-1995-0034848 | 12/1995 |

OTHER PUBLICATIONS

Moschner et al., "Thermo-Catalytic Deposition of Silicon Nitride—A new method for excellent silicon surface passivation", *29th IEEE Photovoltaic Specialists Conference*, New Orleans, (May 2002); 4 pages.

\* cited by examiner

ORGANIC LIGHT EMITTING DISPLAY AND METHOD OF FABRICATING THE SAME

CROSS-REFERENCE TO RELATED APPLICATIONS

This application claims priority to and the benefit of Korean Patent Application No. 10-2005-0054164, filed Jun. 22, 2005, the disclosure of which is incorporated herein by reference in its entirety.

BACKGROUND OF THE INVENTION

1. Field of the Invention

The present invention relates to an organic light emitting display (OLED), and more particularly, to fabricating passivation layers for an OLED.

2. Description of the Related Technology

Recent rapid development in the information technology (IT) sector has fostered rapid growth in the display industry. A display device like a conventional CRT is not suitable for new IT media since it lacks mobility due to limitations of its size, weight, power consumption, resolution, and the like. Accordingly, conventional CRTs are being replaced with flat panel displays including thin film transistor liquid crystal displays (TFT LCDs), plasma display panels (PDPs), and organic light emitting displays (OLEDs).

Among flat panel displays, an OLED is advantageous as a moving picture display, regardless of the device size, because it has fast response speed of about 1 ms or less, low power consumption, and is an emissive display and thus has an unrestricted viewing angle. In addition, the OLED has attracted attention as a new generation flat display because it can be fabricated at low temperature using conventional semiconductor fabrication techniques.

The OLED comes in an active driving type and a passive diving type which have different driving methods. The active driving type OLED is equipped with an array including thin film transistors.

The thin film transistors may need to have a high S factor to improve the grayscale display capability and a high mobility to effectively drive a circuit. In a pixel region of the OLED, the higher the S factor of the thin film transistors, the more finely its current capacity can be controlled with respect to an applied voltage, and thus the more precisely the grayscale can be expressed. In a circuit region of the display, the higher the mobility of the thin film transistors, the more favorable on-off control becomes and the faster the response speed in response to a display state becomes, which improves display quality.

However, when the thin film transistors of the circuit and pixel regions are fabricated simultaneously on one substrate, for example, in a system-on-panel (SOP), it is difficult to simultaneously increase both the S factor and mobility of the thin film transistors. While the mobility of the thin film transistor in the circuit region can increase owing to a hydrogen passivation effect, the S factor of the thin film transistor in the pixel region may decrease, and thus the grayscale display capability may deteriorate.

SUMMARY OF CERTAIN INVENTIVE ASPECTS

One aspect of the invention provides an organic light emitting display (OLED) device. The device comprises: a substrate; a thin film transistor (TFT) disposed over the substrate; a first inorganic passivation layer disposed over the thin film transistor, the first inorganic passivation layer comprising hydrogen; a second inorganic passivation layer disposed over the first inorganic passivation layer, the second inorganic passivation layer comprising hydrogen, the second inorganic passivation layer having a hydrogen content substantially higher than that of the first inorganic passivation layer; and an organic light emitting pixel disposed over the second inorganic passivation layer and electrically connected to the thin film transistor.

The second inorganic passivation layer may have a hydrogen content about 5 atom % to about 10 atom % higher than that of the first inorganic passivation layer. The first inorganic passivation layer may have a hydrogen content less than about 10 atom %. The second inorganic passivation layer may have a hydrogen content of about 15 atom % to about 20 atom %. The first inorganic passivation layer may have a thickness between about 1,000 Å and about 3,000 Å. The second inorganic passivation layer may have a thickness between about 4,000 Å and about 6,000 Å.

The thin film transistor may comprise a semiconductor layer comprising polycrystalline silicon, and at least some polycrystalline silicon of the semiconductor layer may be passivated with hydrogen. At least one of the first and second inorganic passivation layers may comprise silicon nitride. The first inorganic passivation layer may comprise an inorganic material, and the second inorganic passivation layer may comprise the inorganic material. The device may further comprise a planarization layer interposed between the second passivation layer and the organic light emitting pixel, wherein the organic light emitting pixel may comprise an organic light emitting diode.

The substrate defines a pixel region and a non-pixel region, and the TFT may comprise a PMOS TFT formed in the pixel region and an NMOS TFT formed in the non-pixel region. The PMOS TFT may have an S-factor of higher than about 0.30. The NMOS TFT may have a mobility of higher than about 40 cm$^2$/Vs.

Another aspect of the invention provides a method of fabricating an organic light emitting display (OLED) device. The method comprises: providing a device comprising a substrate and a thin film transistor formed over the substrate, the thin film transistor comprising a semiconductor layer; forming a first inorganic passivation layer over the thin film transistor, the first inorganic passivation layer comprising hydrogen; forming a second inorganic passivation layer over the first inorganic passivation layer, the second inorganic passivation layer comprising hydrogen; and forming an organic light emitting pixel over the second inorganic passivation layer, wherein prior to forming the second inorganic passivation layer, the method further may comprise subjecting the first inorganic passivation layer and the thin film transistor to a thermal treatment.

The thermal treatment may passivate at least part of the semiconductor layer with hydrogen migrated from the first inorganic passivation layer. The semiconductor layer may comprise more hydrogen after the thermal treatment than before. The first inorganic passivation layer may comprise more hydrogen before the thermal treatment than after.

The method may not comprise a thermal treatment that can substantially homogenize hydrogen contents of the first and second inorganic passivation layers. The method may not comprise a thermal treatment that can migrate a substantial amount of hydrogen from the second inorganic passivation layer to the first inorganic passivation layer. The thermal treatment may comprise heating the first inorganic passivation layer to a temperature between about 350° C. to about 420° C. At least one of the first and second inorganic passivation layers may comprise silicon nitride.

Another aspect of the invention provides a method of fabricating an organic light emitting display (OLED) capable of improving an S factor of a thin film transistor in a pixel region while maintaining mobility of a thin film transistor in a circuit region.

Another aspect of the invention provides an OLED. The OLED includes a substrate and a thin film transistor disposed on the substrate. A first inorganic passivation layer is disposed on the thin film transistor. A second inorganic passivation layer whose hydrogen content is higher than that of the first inorganic passivation layer is formed on the first inorganic passivation layer. A pixel electrode electrically connected to the thin film transistor is disposed on the second inorganic passivation layer.

Yet another aspect of the invention provides a method of fabricating an OLED. The method includes forming a thin film transistor on a substrate. A first inorganic passivation layer is formed on the thin film transistor. The substrate having the first inorganic passivation layer is thermally treated so as to passivate a semiconductor layer of the thin film transistor with hydrogen. A second inorganic passivation layer is formed on the first inorganic passivation layer. A pixel electrode is formed to be electrically connected to the thin film transistor on the second inorganic passivation layer.

BRIEF DESCRIPTION OF THE DRAWINGS

The above and other features of the present invention will be described in reference to certain exemplary embodiments thereof with reference to the attached drawings in which.

DETAILED DESCRIPTION OF CERTAIN INVENTIVE EMBODIMENTS

The invention will now be described more fully hereinafter with reference to the accompanying drawings, in which exemplary embodiments of the invention are shown.

Figure 4:
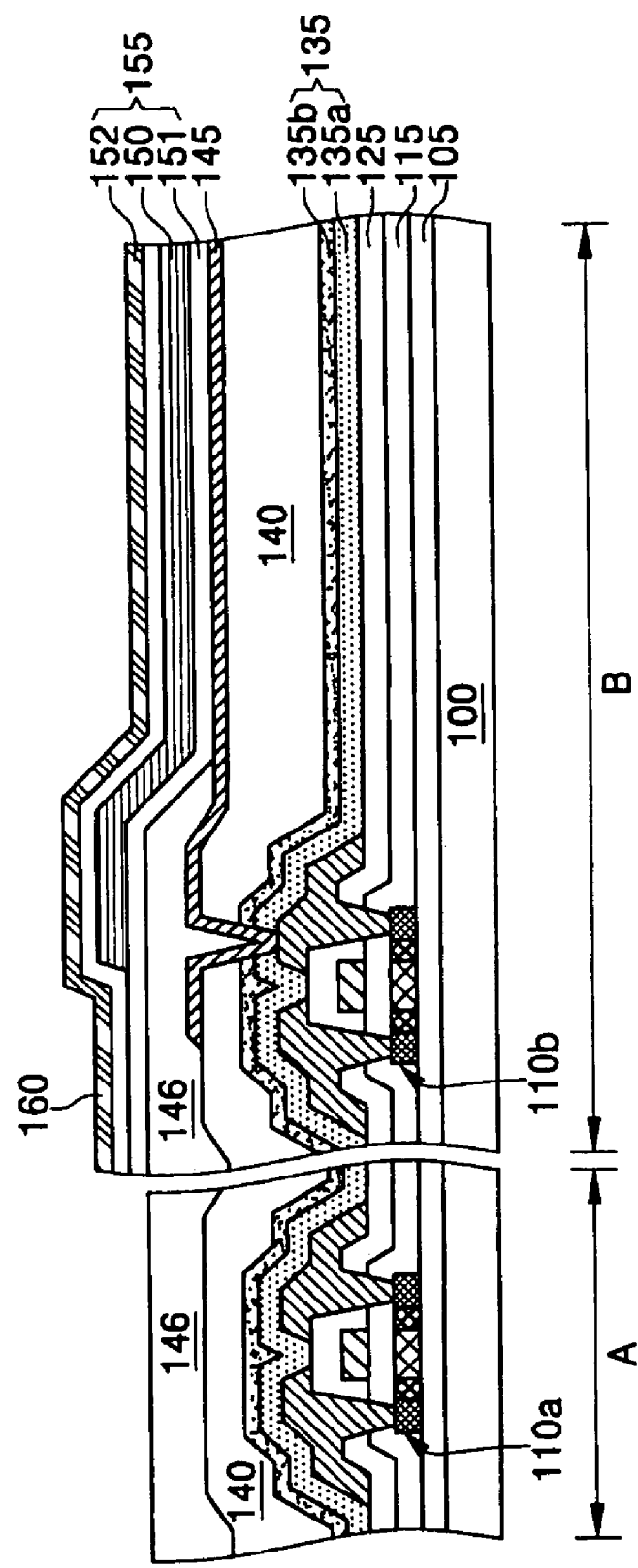

FIG. 4 is a cross-sectional view illustrating an OLED according to one embodiment. Referring to FIG. 4, thin film transistors are disposed on a substrate having a circuit region A and a pixel region B. Each of the transistors includes a semiconductor layer 110a and 110b, a gate electrode 120, and source/drain electrodes 130a, 130c/130b and 130d. The semiconductor layers 110a and 110b of the thin film transistors may be formed of hydrogenated polycrystalline silicon layers. The thin film transistor disposed in the circuit region A may be an NMOS thin film transistor, whereas the thin film transistor disposed in the pixel region B may be a PMOS thin film transistor.

A first inorganic passivation layer 135a is disposed on the thin film transistors, and a second inorganic passivation layer 135b is formed on the first inorganic passivation layer 135a. The first inorganic passivation layer 135a and/or the second inorganic passivation layer 135b may include silicon nitride. In one embodiment, each of the first and second inorganic passivation layers 135a and 135b may include silicon nitride.

In one embodiment, the second inorganic passivation layer 135b may contain more hydrogen than the first inorganic passivation layer 135a. Further, a difference in hydrogen content between the first and second inorganic passivation layers 135a and 135b may be about 5 to about 10 atom percent (at. %). In one embodiment, the hydrogen content of the first inorganic passivation layer 135a may be about 10 at. % or less, and the hydrogen content of the second inorganic passivation layer 135b may be about 15 to about 20 at. %. The difference in hydrogen content between the layers 135a and 135b is due to contribution of the hydrogen contained in the first inorganic passivation layer 135a to hydrogen passivation of the polycrystalline silicon layers of the semiconductor layers 110a and 110b.

In one embodiment, the degree of hydrogen passivation may be controlled by the thickness of the first inorganic passivation layer 135a and by annealing conditions after formation of the first inorganic passivation layer 135a. Thus, the thickness of the first inorganic passivation layer 135a affecting hydrogen passivation may be adjusted to ensure a satisfactory S factor of the PMOS thin film transistor and mobility of the NMOS thin film transistor. In one embodiment, the first inorganic passivation layer 135a may have a thickness of about 1,000 to about 3,000 Å.

Also, the second inorganic passivation layer 135b may be adjusted in thickness, thereby serving to substantially entirely cover surface step by the source/drain electrodes 130a, 130c/130b and 130d. The second inorganic passivation layer 135b may have a thickness of about 4,000 to about 6,000 Å, depending on the thickness of the first inorganic passivation layer 135a. The first and second inorganic passivation layers may have a combined thickness of about 7,000 Å or less in order to prevent the phenomenon that the color coordinates of an organic light emitting diode change depending on a viewing angle.

Accordingly, the inorganic passivation layers 135 maintain the mobility of the NMOS thin film transistor and prevent on/off and response speed properties from deteriorating while improving the S factor of the PMOS thin film transistor. As a result, grayscale display capability may be improved.

In the case of a top-emission OLED, a planarization layer 140 may be disposed on the second inorganic passivation layer 135b. In addition, a pixel electrode 145 electrically connected to the thin film transistor is disposed on the planarization layer 140 in the pixel region B. An organic layer 155 including an emission layer 150 is disposed on the pixel electrode 145, and a counter electrode 160 is disposed on the organic layer 155. Thus, the OLED is completed.

FIGS. 1 to 4 are cross-sectional views illustrating a method of fabricating an OLED according to an embodiment. First, referring to FIG. 1, thin film transistors are formed on a substrate 100 including a circuit region A and a pixel region B. A polycrystalline silicon layer is formed on the substrate 100, and then is patterned so as to form semiconductor layers 110a and 110b. Before forming the polycrystalline silicon layer, a buffer layer 105 may be formed on the substrate to preventing diffusion of impurities from the substrate 100 to the semiconductor layers 110a and 110b during the fabrication process to be performed later.

A gate insulating layer 115 is formed on the semiconductor layers 110a and 110b. A conductive layer is formed on the gate insulating layer 115 and then is patterned, thereby forming gate electrodes 120 over channel regions of the semiconductor layers 110a and 110b. Subsequently, n-type high- and low-concentration impurity ions are injected into the semiconductor layer 110a in the circuit region A so as to form source and drain regions and a low-concentration doping region, respectively. Also, p-type high-concentration impurity ions are injected into the semiconductor layer 110b in the pixel region B so as to form source and drain regions.

An interlayer insulating layer 125 is formed on the gate electrode 120. Contact holes, which expose the source and drain regions of the semiconductor layers 110a and 110b, are formed in the interlayer insulating layer 125. A conductive layer is formed on the interlayer insulating layer 125 having the contact holes and then is patterned so as to form source electrodes 130a and 130c, and drain electrodes 130b and 130d. As a result, an NMOS thin film transistor may be formed in the circuit region A, while a PMOS thin film transistor may be formed in the pixel region B.

Figure 1:
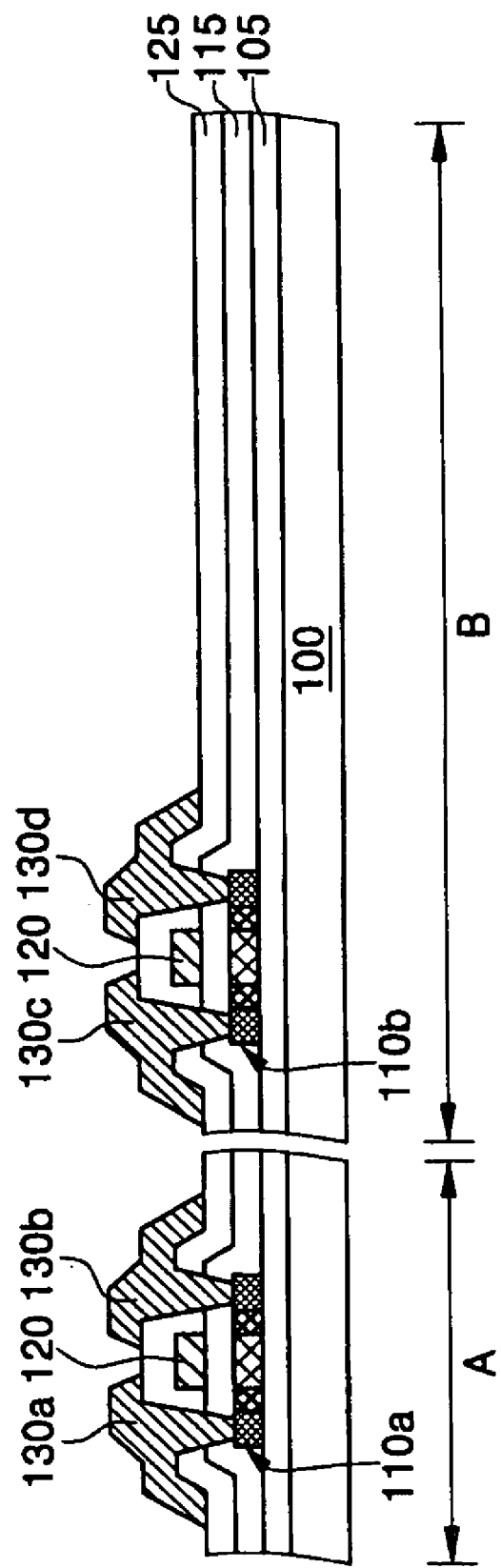
FIGS. 1 to 4 are cross-sectional views illustrating a method of fabricating an OLED according to an embodiment.
Figure 2:
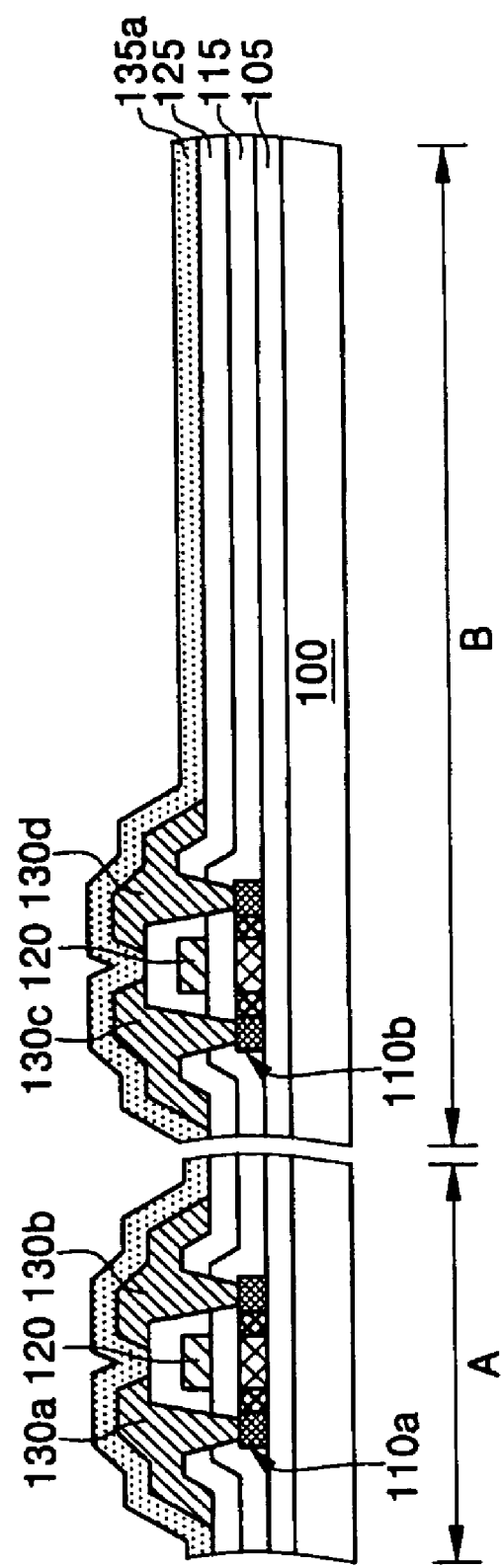

Referring to FIG. 2, a first inorganic passivation layer 135a is formed on the thin film transistors. In one embodiment, the first inorganic passivation layer 135a may be formed of silicon nitride. The silicon nitride layer 135a may be formed by chemical vapor deposition (CVD) using silane ($SiH_4$) and ammonia ($NH_3$) as the precursor gases. In some embodiment, hydrogen may be added to the precursor gases. The first inorganic passivation layer 135a may have a thickness of about 1,000 Å to about 3,000 Å. The silicon nitride layer 135a may serve as a source of hydrogen at a passivation step which will be described below.

Then, the partially fabricated device having the thin film transistor and the first inorganic passivation layer 135a is thermally treated. During this step, the hydrogen migrates from the first passivation layer 135a to the semiconductor layers 110a and 110b of the thin film transistor, and passivates the semiconductor layers 110a and 110b. At this passivation step, at least some broken silicon bonds in the semiconductor layers 110a and 110b are saturated and rendered inactive. The partially fabricated device may be thermally treated at a temperature of about 350° C. to about 420° C., optionally at about 380° C. In other embodiments, the partially fabricated device may be thermally treated using a furnace or a rapid thermal annealing process.

Figure 3:
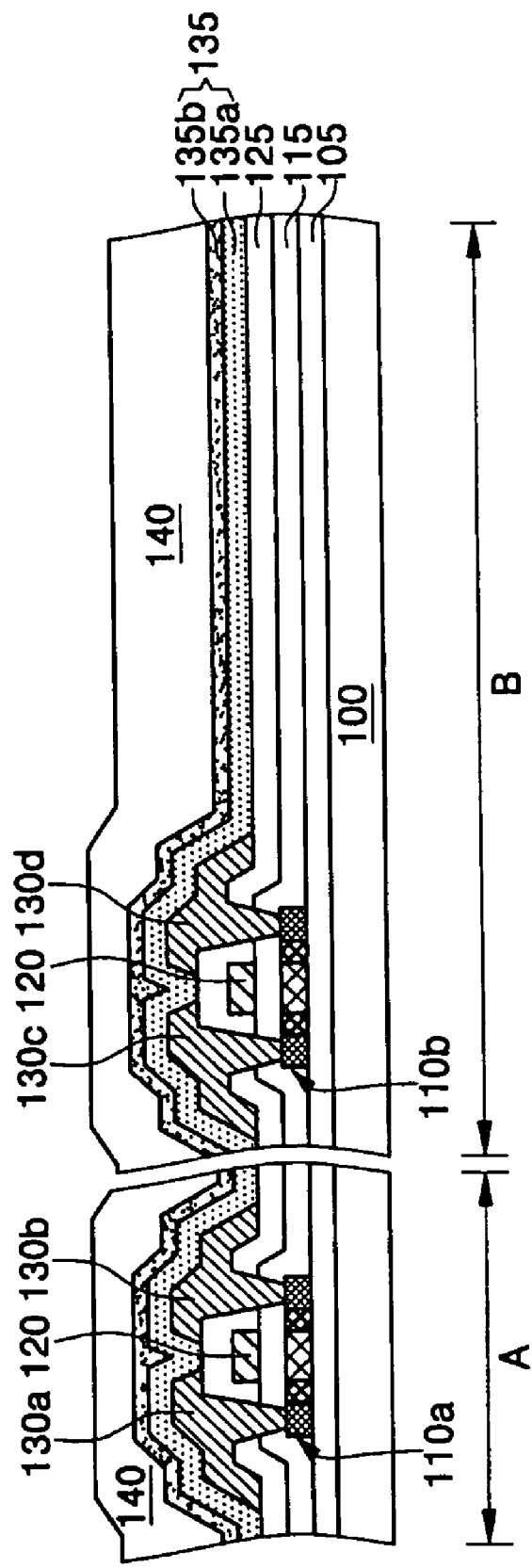

Referring to FIG. 3, a second inorganic passivation layer 135b may be formed on the first inorganic passivation layer 135a. The second passivation layer 135b may be formed as described above with respect to the first passivation layer 135a. The second inorganic passivation layer 135b may be formed to have a thickness of about 4,000 Å to about 6,000 Å. To prevent the change in the color coordinates of an organic light emitting diode depending on a viewing angle, the first and second inorganic passivation layers may have a combined thickness of about 7,000 Å or less.

The hydrogen content in the second inorganic passivation layer 135b may be about 5 to about 10 at. % more than in the first inorganic passivation layer 135a after the thermal treatment. In one embodiment, the hydrogen content in the first inorganic passivation layer 135a may be about 10 at. % or less, while the hydrogen content in the second inorganic passivation layer 135b may be about 15 to about 20 at. %. The difference in the hydrogen content may be substantially equal to an amount of hydrogen contributing to the hydrogenation of the semiconductor layers 110a and 110b. The difference may be controlled by adjusting the thicknesses of the first and second inorganic passivation layers 135a and 135b. The first inorganic passivation layer 135a and/or the second inorganic passivation layer 135b may include silicon nitride. In one embodiment, both of the first and second inorganic passivation layers 135a and 135b include silicon nitride.

In order to fabricate a top-emission OLED, a planarization layer 140 may be formed on an inorganic passivation layer 135 having the first and second inorganic passivation layers 135a and 135b.

Referring to FIG. 4, the planarization layer 140 and the inorganic passivation layer 135 are etched to form a via hole partially exposing a drain electrode 130d in the pixel region B. A conductive layer is formed on the planarization layer 140 having the via hole and then is patterned to form a pixel electrode 145.

An emission layer 150 is formed on the pixel region 145. Common layers 151 and 152 may be formed over or under the emission layer 150. In addition, the common layers 151 and 152 may include at least one layer selected from the group consisting of a hole injection layer, a hole transport layer, a hole blocking layer and an electron injection layer. A counter electrode 160 may be formed on the emission layer 150, and thus an OLED is completed.

Hereinafter, Examples of the invention will be described. However, the invention is not limited to these Examples.

EXAMPLE 1

To fabricate an OLED according to one embodiment, NMOS and PMOS thin film transistors were formed on a substrate. A silicon nitride layer was deposited on the substrate having the thin film transistors to thereby form a first inorganic passivation layer. Here, the first inorganic passivation layer was formed to have a thickness of 1,000 Å. Then, the substrate having the first inorganic passivation layer was thermally treated at about 380° C. for about 2 hours to thereby hydrogenate semiconductor layers of the thin film transistors. The hydrogenation was performed in an $N_2/H_2$ atmosphere. After the heat-treatment, a second inorganic passivation layer was formed of a silicon nitride layer on the first inorganic passivation layer. Here, the second inorganic passivation layer was formed to have a thickness of 6,000 Å.

EXAMPLE 2

Except for forming a first inorganic passivation layer to have a thickness of 2,000 Å, and forming a second inorganic passivation layer to have a thickness of 5,000 Å, an OLED was fabricated by the same method as Example 1.

EXAMPLE 3

Except for forming a first inorganic passivation layer to have a thickness of 3,000 Å, and forming a second inorganic passivation layer to have a thickness of 4,000 Å, an OLED was fabricated by the same method as Example 1.

EXAMPLE 4

NMOS and PMOS thin film transistors were formed on a substrate. A silicon nitride layer was deposited on the substrate having the thin film transistors to form an inorganic passivation layer. Here, the inorganic passivation layer was formed to have a thickness of 7,000 Å. In addition, the substrate having the inorganic passivation layer was thermally treated to thereby hydrogenate semiconductor layers of the thin film transistors.

EXAMPLE 5

S factors of the PMOS thin film transistors were as follows, which were obtained from Examples 1, 2, 3 and 4.

TABLE 1

| | First inorganic passivation layer | Second inorganic passivation layer | S factor |
|---|---|---|---|
| Example 1 | 1000 Å | 6000 Å | 0.37 |
| Example 2 | 2000 Å | 5000 Å | 0.34 |
| Example 3 | 3000 Å | 4000 Å | 0.32 |
| Example 4 | 7000 Å | 0 Å | 0.27 |

EXAMPLE 6

S factors of the NMOS thin film transistors were as follows, which were obtained from Examples 1, 2, 3 and 4.

TABLE 2

|  | First inorganic passivation layer | Second inorganic passivation layer | S factor |
|---|---|---|---|
| Example 1 | 1000 Å | 6000 Å | 50.91 |
| Example 2 | 2000 Å | 5000 Å | 64.58 |
| Example 3 | 3000 Å | 4000 Å | 68.60 |
| Example 4 | 7000 Å | 0 Å | 88.12 |

As shown in Examples 5 and 6, even if inorganic passivation layers are formed of the same material and to have the same thickness, it can be seen that when a first inorganic passivation layer is formed to perform hydrogen passivation and then a second inorganic passivation layer is formed, the S factor of the PMOS thin film transistor increases. It can also be seen that original properties of a thin film transistor in a circuit region may be maintained, in the view of the fact that when mobility of the NMOS thin film transistor is 40 cm$^2$/Vs or more, on/off properties may be maintained. Thus, by the inorganic passivation layers, the on/off properties of the NMOS thin film transistor can be maintained while the S factor of the PMOS thin film transistor is improved, thereby increasing grayscale display capability.

In an OLED and a method of fabricating the same according to the embodiments, on/off properties of a thin film transistor in a circuit region can be maintained and an S factor of a thin film transistor in a pixel region can be improved by forming inorganic passivation layers to have different hydrogen contents from each other. As a result, an OLED, which has improved grayscale display capability and minimizes effects to the operation of the circuit, can be fabricated.

While it is described with reference to exemplary embodiments of the invention, it will be understood by those of ordinary skill in the art that various changes in form and details may be made without departing from the spirit and scope of the present invention as set forth in the following claims.

What is claimed is:

1. An organic light emitting display (OLED) device, comprising:
    a substrate;
    a thin film transistor (TFT) disposed over the substrate, the thin film transistor containing hydrogen;
    a first inorganic passivation layer disposed over the thin film transistor, the first inorganic passivation layer comprising hydrogen;
    a second inorganic passivation layer disposed on and contacting the first inorganic passivation layer, the second inorganic passivation layer comprising hydrogen, the second inorganic passivation layer having a hydrogen content substantially higher than that of the first inorganic passivation layer, wherein the difference in the hydrogen content between the first and second inorganic passivation layers is substantially equal to a hydrogen content in the thin film transistor; and
    an organic light emitting pixel disposed over the second inorganic passivation layer and electrically connected to the thin film transistor,
    wherein the second inorganic passivation layer has a thickness between about 4,000 Å and about 6,000 Å.

2. The device of claim 1, wherein the second inorganic passivation layer has a hydrogen content about 5 atom % to about 10 atom % higher than that of the first inorganic passivation layer.

3. The device of claim 1, wherein the first inorganic passivation layer has a hydrogen content less than about 10 atom %.

4. The device of claim 1, wherein the second inorganic passivation layer has a hydrogen content of about 15 atom % to about 20 atom %.

5. The device of claim 1, wherein the first inorganic passivation layer has a thickness between about 1,000 Å and about 3,000 Å.

6. The device of claim 1, wherein the thin film transistor comprises a semiconductor layer comprising polycrystalline silicon, and wherein at least some polycrystalline silicon of the semiconductor layer is passivated with hydrogen.

7. The device of claim 1, wherein at least one of the first and second inorganic passivation layers comprises silicon nitride.

8. The device of claim 1, wherein the first inorganic passivation layer comprises an inorganic material, and wherein the second inorganic passivation layer comprises the inorganic material.

* * * * *

UNITED STATES PATENT AND TRADEMARK OFFICE
CERTIFICATE OF CORRECTION

| | | |
|---|---|---|
| PATENT NO. | : 8,044,576 B2 | Page 1 of 1 |
| APPLICATION NO. | : 11/473830 | |
| DATED | : October 25, 2011 | |
| INVENTOR(S) | : Eui-Hoon Hwang | |

It is certified that error appears in the above-identified patent and that said Letters Patent is hereby corrected as shown below:

At column 1, line 37, please delete "diving" and insert --driving--, therefor.

Signed and Sealed this
Twenty-eighth Day of August, 2012

David J. Kappos
*Director of the United States Patent and Trademark Office*